United States Patent
Kim et al.

(10) Patent No.: US 8,022,725 B2
(45) Date of Patent: Sep. 20, 2011

(54) CONVERTIBLE LOGIC CIRCUITS COMPRISING CARBON NANOTUBE TRANSISTORS HAVING AMBIPOLAR CHARATERISTICS

(75) Inventors: Un-jeong Kim, Busan (KR); Young-hee Lee, Suwon-si (KR); Eun-hong Lee, Anyang-si (KR); Woo-jong Yu, Gwangju (KR)

(73) Assignees: Samsung Electronics Co., Ltd., Gyeonggi-do (KR); Sungkyunkwan University Foundation for Corporate Collaboration, Gyeonggi-do (KR)

( * ) Notice: Subject to any disclaimer, the term of this patent is extended or adjusted under 35 U.S.C. 154(b) by 0 days.

(21) Appl. No.: 12/232,956

(22) Filed: Sep. 26, 2008

(65) Prior Publication Data
US 2009/0267647 A1    Oct. 29, 2009

(30) Foreign Application Priority Data
Apr. 25, 2008  (KR) .................. 10-2008-0038897

(51) Int. Cl.
*H03K 19/173* (2006.01)
(52) U.S. Cl. ........................................... 326/50; 326/49
(58) Field of Classification Search .................... 326/50, 326/104, 109, 111, 112, 120
See application file for complete search history.

(56) References Cited

U.S. PATENT DOCUMENTS

| | | | | |
|---|---|---|---|---|
| 7,115,960 | B2 * | 10/2006 | Bertin et al. | 257/420 |
| 7,288,970 | B2 * | 10/2007 | Bertin | 326/120 |
| 7,492,015 | B2 * | 2/2009 | Chen et al. | 257/369 |
| 7,535,016 | B2 * | 5/2009 | Furukawa et al. | 257/20 |
| 7,622,732 | B1 * | 11/2009 | Tombler, Jr. | 257/9 |
| 2006/0183278 | A1 * | 8/2006 | Bertin et al. | 438/197 |
| 2007/0102747 | A1 * | 5/2007 | Chen et al. | 257/314 |
| 2008/0143389 | A1 * | 6/2008 | Keshavarzi et al. | 326/112 |

* cited by examiner

*Primary Examiner* — Shawki S Ismail
*Assistant Examiner* — Crystal L Hammond
(74) *Attorney, Agent, or Firm* — Harness, Dickey & Pierce, PLC

(57) ABSTRACT

A convertible logic circuit includes a plurality of carbon nanotube transistors. Each carbon nanotube transistors are configurable as p-type or an n-type transistors according to a voltage of a power source voltage. Each carbon nanotube transistor includes a source electrode, a drain electrode, a channel formed of a carbon nanotube between the source electrode and the drain electrode, a gate insulating layer formed on the carbon nanotubes, and a gate electrode formed on the gate insulating layer.

19 Claims, 7 Drawing Sheets

$V_{dd} = -5V$

| $V_{in}$ | Tr11 | Tr12 | $V_{out}$ |
|---|---|---|---|
| -5V | OFF | ON | 0V |
| 0V | ON | OFF | -5V |

$V_{dd}$ = 5V

| $V_{in}$ | Tr11 | Tr12 | $V_{out}$ |
|---|---|---|---|
| 0V | ON | OFF | 5V |
| 5V | OFF | ON | 0V |

| $V_{in}A$ | $V_{in}B$ | Tr21 | Tr22 | Tr23 | Tr24 | $V_{out}$ |
|---|---|---|---|---|---|---|
| -5V | -5V | OFF | ON | OFF | ON | 0V |
| -5V | 0V | OFF | ON | ON | OFF | 0V |
| 0V | -5V | ON | OFF | OFF | ON | 0V |
| 0V | 0V | ON | OFF | ON | OFF | -5V |

| $V_{in}A$ | $V_{in}B$ | Tr21 | Tr22 | Tr23 | Tr24 | $V_{out}$ |
|---|---|---|---|---|---|---|
| 5V | 5V | OFF | ON | OFF | ON | 0V |
| 5V | 0V | OFF | ON | ON | OFF | 0V |
| 0V | 5V | ON | OFF | OFF | ON | 0V |
| 0V | 0V | ON | OFF | ON | OFF | 5V |

$V_{dd} = -5V$

| $V_{in}A$ | $V_{in}B$ | Tr31 | Tr32 | Tr33 | Tr34 | $V_{out}$ |
|---|---|---|---|---|---|---|
| −5V | −5V | OFF | ON | OFF | ON | 0V |
| −5V | 0V | OFF | ON | ON | OFF | −5V |
| 0V | −5V | ON | OFF | OFF | ON | −5V |
| 0V | 0V | ON | OFF | ON | OFF | −5V |

| $V_{in}A$ | $V_{in}B$ | Tr31 | Tr32 | Tr33 | Tr34 | $V_{out}$ |
|---|---|---|---|---|---|---|
| 5V | 5V | OFF | ON | OFF | ON | 0V |
| 5V | 0V | OFF | ON | ON | OFF | 5V |
| 0V | 5V | ON | OFF | OFF | ON | 5V |
| 0V | 0V | ON | OFF | ON | OFF | 5V |

CONVERTIBLE LOGIC CIRCUITS COMPRISING CARBON NANOTUBE TRANSISTORS HAVING AMBIPOLAR CHARATERISTICS

PRIORITY STATEMENT

This non-provisional U.S. patent application claims priority under 35 U.S.C. §119 to Korean Patent Application No. 10-2008-0038897, filed on Apr. 25, 2008, in the Korean Intellectual Property Office, the entire contents of which is incorporated herein by reference.

BACKGROUND

DESCRIPTION OF THE RELATED ART

Conventional carbon nanotube transistors that use carbon nanotubes as a channel usually have an ambipolar characteristic. However, applying conventional carbon nanotube transistors to semiconductor devices, such as complementary metal-oxide-semiconductor (CMOS) transistors, requires p-type and n-type carbon nanotube transistors.

Conventionally, carbon nanotube transistors are formed by doping. However, stable doping under atmospheric conditions is difficult. Although efforts to perform p-type doping and n-type doping with nitrogen or boron have been conducted, the effect of this type of doping is unclear. Methods of doping potassium (K), which is an alkali metal, and methods of coating a polymer such as polyethylenimine (PEI) have also been disclosed. However, in these conventional methods, doping under atmospheric conditions is still relatively unstable and relatively difficult to perform. Thus, it is relatively difficult to form realistic and practical CMOS-type logic circuits using conventional doping methods.

SUMMARY

Example embodiments relate to configurable or convertible logic circuits in which a carbon nanotube transistor may be converted to (configured as) a p-type transistor or an n-type transistor using an ambipolar characteristic of a field effect transistor (FET) having carbon nanotubes as a channel.

Example embodiments provide logic circuits that use ambipolar characteristics of carbon nanotube transistors. For example, logic circuits according to example embodiments are capable of converting (or configuring) a transistor to (as) a p-type transistor or an n-type transistor by controlling an application of a power source voltage to a carbon nanotube transistor.

At least one example embodiment provides a convertible or configurable logic circuit including a plurality of carbon nanotube transistors having an ambipolar characteristic. Each of the plurality of carbon nanotube transistors may be configurable as a p-type or an n-type transistor according to a voltage level of a power source voltage.

At least one example embodiment provides a convertible or configurable logic circuit including a plurality of carbon nanotube transistors having ambipolar characteristics. The carbon nanotube transistors may be field effect transistors. Each carbon nanotube transistor may include a source electrode, a drain electrode, and a channel formed between the source electrode and the drain electrode. The channel may be a carbon nanotube. A gate insulating layer may be formed on the carbon nanotube, and a gate electrode may be formed on the gate insulating layer. The carbon nanotube transistors may be converted to (configured as) a p-type or an n-type according to a voltage of a power source voltage.

According to at least some example embodiments, the logic circuit may include a first transistor and a second transistor connected in series. An input voltage may be connected to gates of the first transistor and the second transistor. A power source voltage may be connected to a first electrode of the first transistor. A ground voltage may be applied to a second electrode of the second transistor. An output voltage may be output between the first transistor and the second transistor.

According to at least some example embodiments, if the power source voltage is a first negative voltage, the first transistor may act as an n-type transistor and the second transistor may act as a p-type transistor. Alternatively, if the power source voltage is a first positive voltage, the first transistor may act as a p-type transistor and the second transistor may act as an n-type transistor. The logic circuit may act as a first logic circuit or a second logic circuit according to the power source voltage. The first and second logic circuits may be different types of logic circuits. For example, the first logic circuit may be a NOR logic circuit and the second logic circuit may be a NAND logic circuit.

According to at least some example embodiments, the logic circuit may include first, second, third, and fourth transistors. The first transistor and the second transistor may have gates that receive a first input signal. The third transistor and the fourth transistor may have gates that receive a second input signal. The first transistor and the third transistor may be connected in series, whereas the second transistor and the fourth transistor may be connected in parallel. The power source voltage may be connected to a first electrode of the first transistor. The ground voltage may be applied to first electrodes of the second transistor and the fourth transistor. An output voltage may be output from a common node between the second electrode of the second transistor, a second electrode of the fourth transistor and a second electrode of the third transistor.

According to at least some example embodiments, if the power source voltage is a first negative voltage, the first and third transistors may act as n-type transistors, whereas the second and fourth transistors may act as p-type transistors. In this example, the logic circuit forms a NAND logic circuit. Alternatively, if the power source voltage is a first positive voltage, the first and third transistors may act as p-type transistors, whereas the second and fourth transistors may act as n-type transistors. In this case, the logic circuit forms a NOR logic circuit.

According to at least some example embodiments, the logic circuit may include first, second, third, and fourth transistors. The first transistor and the second transistor may have gates that receive a first input signal, whereas the third transistor and the fourth transistor may have gates that receive a second input signal. The first transistor and the third transistor may be connected in parallel, whereas the second transistor and the fourth transistor may be connected in series. A first electrode of the fourth transistor may be connected to the ground voltage. First electrodes of the first and third transistors may be connected to the power source voltage. An output voltage may be output from a common node between a second electrode of the first transistor, a second electrode of the third transistor and a second electrode of the second transistor.

According to at least some example embodiments, if the power source voltage is a first negative voltage, the first and third transistors may act as n-type transistors, whereas the second and fourth transistors may act as p-type transistors. In this example, the logic circuit forms a NOR logic circuit. Alternatively, if the power source voltage is a first positive voltage, the first and third transistors may act as p-type transistors, whereas the second and fourth transistors may act as n-type transistors. In this case, the logic circuit forms a NAND logic circuit.

BRIEF DESCRIPTION OF THE DRAWINGS

The present invention will become more apparent by describing in detail example embodiments thereof with reference to the attached drawings in which:

FIG. 9 is a truth table of an example embodiment of the logic circuit of FIG. 8 when a power source voltage $V_{dd}$ is about −5V;

FIG. 10 is another truth table of an example embodiment of the logic circuit of FIG. 8 when a power source voltage $V_{dd}$ is about 5V;

FIG. 13 is another truth table of an example embodiment of the logic circuit of FIG. 11 when a power source voltage $V_{dd}$ is about 5V.

DETAILED DESCRIPTION OF EXAMPLE EMBODIMENTS

Figure 1:
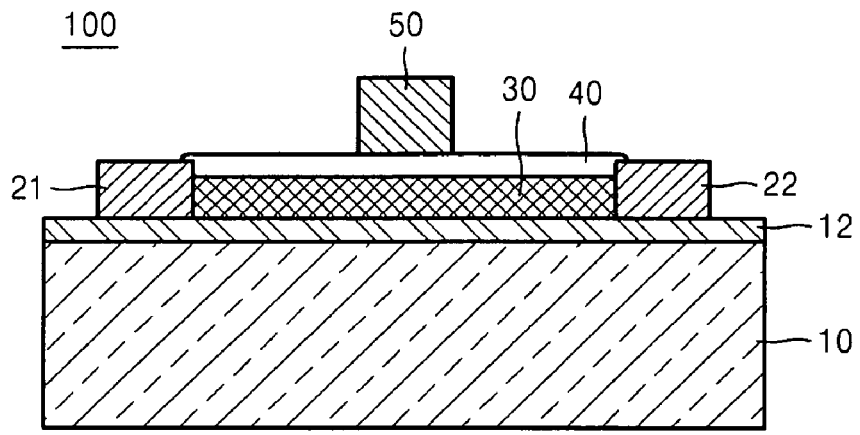
FIG. 1 is a schematic cross-sectional view of a field effect transistor having a carbon nanotube according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

Further, it will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

Further still, it will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Convertible logic circuits including carbon nanotube transistors having ambipolar characteristics according to example embodiments will now be described more fully with reference to the accompanying drawings In the drawings, the thicknesses of layers and regions are exaggerated for clarity, and like reference numerals refer to the like elements.

FIG. 1 is a schematic cross-sectional view of an example embodiment of a carbon nanotube transistor 100. The carbon nanotube transistor 100 may be a field effect transistor (FET) having a carbon nanotube 30.

Referring to FIG. 1, an insulating layer 12 may be formed on a substrate 10, for example, a silicon substrate. A source electrode 21 and a drain electrode 22 may be formed on the insulating layer 12. The source electrode 21 and the drain electrode 22 may be separated from each other on the insulating layer 12. The source electrode 21 and the drain electrode 22 may be, for example, Au/Ti layers or the like. A carbon nanotube 30 may be formed between the source electrode 21 and the drain electrode 22. The carbon nanotube 30 may serve as a channel of the carbon nanotube transistor 100. The carbon nanotube 30 may be composed of random network single-walled carbon nanotubes having a network structure, which may be grown on (e.g., directly on) the insulating layer 12 using, for example, a chemical vapor deposition (CVD) method.

A gate insulating layer 40 may be formed on the carbon nanotube 30 using, for example, aluminum oxide (alumina) or the like. A gate electrode 50 (e.g., an Au/Ti layer) may be formed on the gate insulating layer 40.

Figure 2:
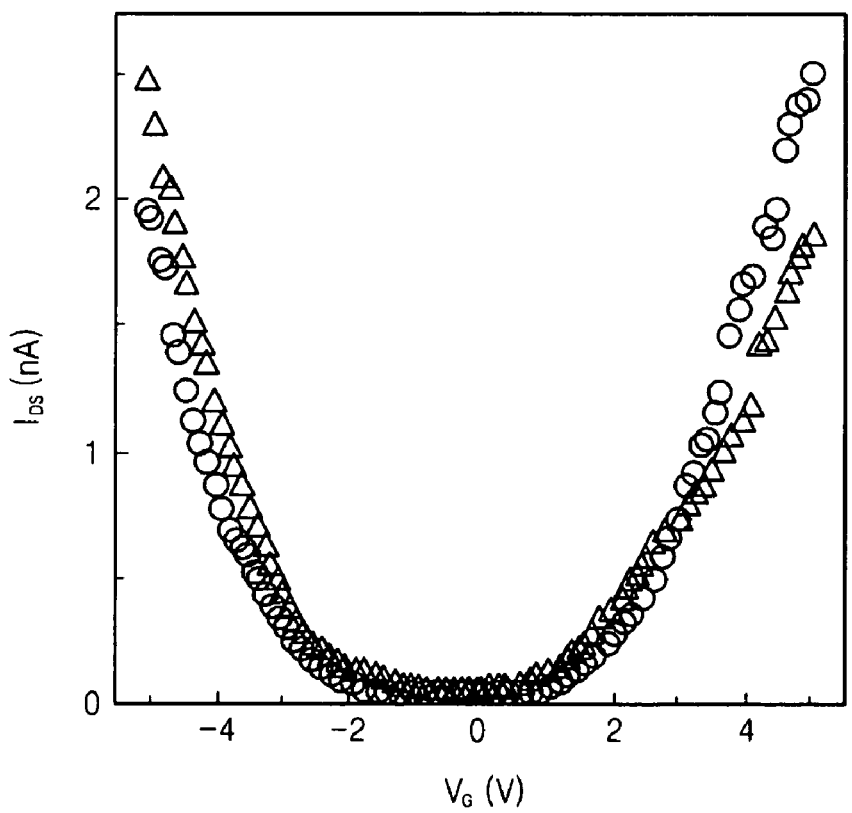
FIG. 2 is graph showing measurement results of drain current according to gate voltage when a voltage of about 1V is applied to a drain electrode in two carbon nanotube transistors having the structure of FIG: 1.

FIG. 2 is graph showing measurement results of drain current according to gate voltage when a voltage of about 1V is applied to the drain electrode 22 in two carbon nanotube transistors having a structure according to the example embodiment shown in FIG. 1.

Referring to FIG. 2, the two carbon nanotube transistors are turned on when a gate voltage is increased from about 0V, which shows an n-type characteristic. Also, the two carbon nanotube transistors are turned on when the gate voltage is reduced from about 0V, which shows a p-type characteristic. Thus, the carbon nanotube transistors show an ambipolar characteristic. In FIG. 2, the gate voltage at which the carbon nanotube transistors turn on may be changed according to characteristics of the carbon nanotube transistors.

An example embodiment of a method of using carbon nanotube transistors having an ambipolar characteristic for a CMOS type logic circuit without doping will now be described.

Figures 3, 4:
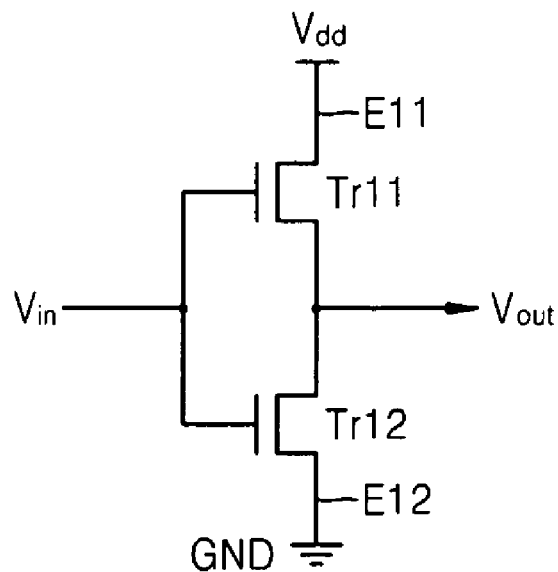
FIG. 3 is an example embodiment of an inverter circuit including two carbon nanotube transistors having the same ambipolar characteristics.
FIG. 4 is a truth table of the example embodiment of the logic circuit of FIG. 3 when a power source voltage $V_{dd}$ is about −5V.

FIG. 3 is an example embodiment of an inverter circuit including a plurality of (e.g., two) carbon nanotube transistors having the same or substantially the same ambipolar characteristic.

Referring to FIG. 3, a first transistor Tr11 and a second transistor Tr12 may be connected in series. Gates of the first transistor Tr11 and the second transistor Tr12 may be connected to an input voltage $V_{in}$. A first electrode E11 of the first transistor Tr11 may be connected to a power source voltage $V_{dd}$. A first electrode E12 of the second transistor Tr12 may be connected to a ground voltage GND. An output voltage $V_{out}$ may be output from a common node between the first transistor Tr11 and the second transistor Tr12. Each of the first transistor Tr11 and the second transistor Tr12 may be structured as the carbon nanotube transistor of FIG. 1, which has an ambipolar characteristic.

FIG. 4 is a truth table of an example embodiment of the logic circuit of FIG. 3 when the power source voltage $V_{dd}$ is about −5V. When the input voltage $V_{in}$ is about −5V, a gate voltage $V_{gs}$ sensed by the first transistor Tr11 is about 0V, and a gate voltage $V_{gs}$ sensed by the second transistor Tr12 is about −5V. As a result, the second transistor Tr12 turns on and the output voltage $V_{out}$ is the ground voltage GND of about 0V.

When the input voltage $V_{in}$ is about 0V, a gate voltage $V_{gs}$ sensed by the first transistor Tr11 is about 5V. As a result, the first transistor Tr11 turns on, showing an n-type characteristic. The gate voltage $V_{gs}$ sensed by the second transistor Tr12 is about 0V, and thus, the second transistor Tr12 shows a p-type characteristic. Accordingly, the output voltage $V_{out}$ is the power source voltage $V_{dd}$ of about −5V, which is opposite to the input voltage $V_{in}$.

According to at least this example embodiment, the first transistor Tr11 shows an n-type characteristic, whereas the second transistor Tr12 shows a p-type characteristic. Thus, the logic circuit of FIG. 3 functions as an inverter circuit. In this example, a logic circuit is formed using carbon nanotube transistors having ambipolar characteristics.

Figures 5, 6:
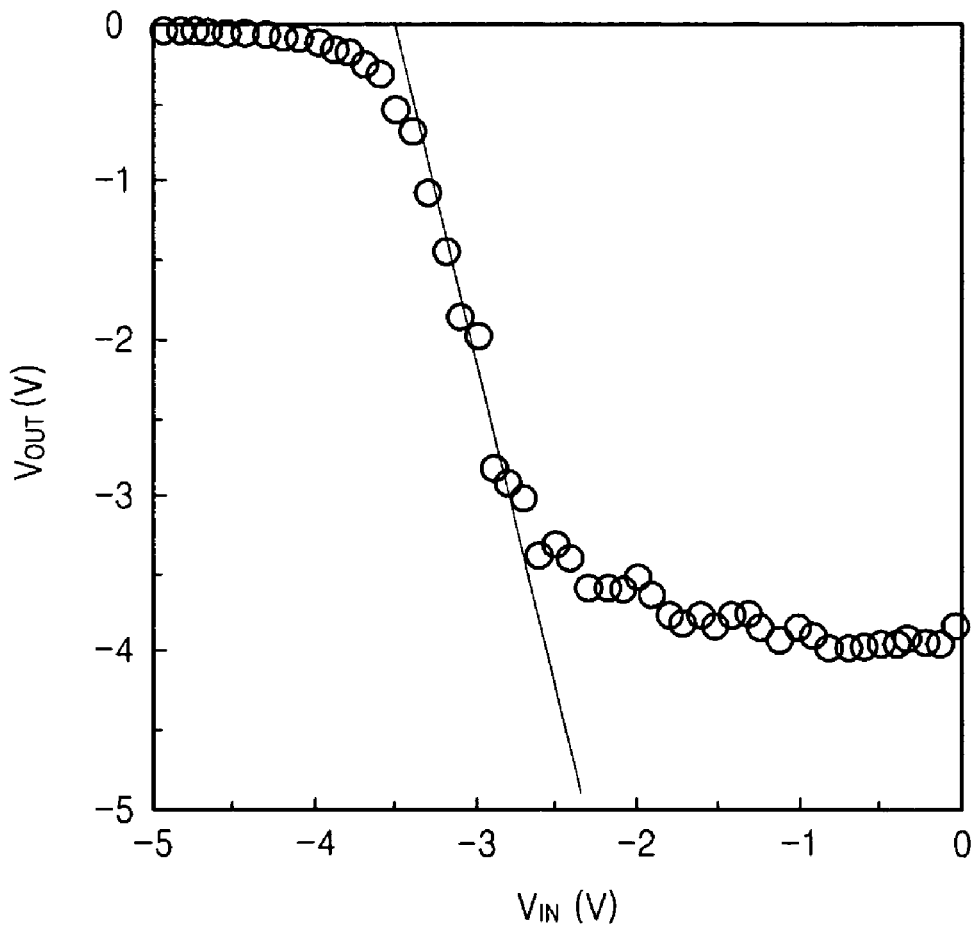
FIG. 5 is graph showing an inverter characteristic of the carbon nanotube transistors when the power source voltage $V_{dd}$ is about −5V according to an example embodiment.
FIG. 6 is another truth table of the example embodiment of the logic circuit of FIG. 3 when a power source voltage $V_{dd}$ is about 5V.

FIG. 5 is graph showing an example embodiment of an inverter characteristic of the carbon nanotube transistors when the power source voltage $V_{dd}$ is about −5V.

FIG. 6 is another truth table of an example embodiment of the logic circuit of FIG. 3 when a power source voltage $V_{dd}$ is about 5V. When the input voltage $V_{in}$ is about 0V, a gate voltage $V_{gs}$ sensed by the first transistor Tr11 is about −5V, whereas a gate voltage $V_{gs}$ sensed by the second transistor Tr12 is about 0V. Thus, the first transistor Tr11 turns on and the output voltage $V_{out}$ is about 5V. In this example, the circuit of FIG. 3 functions as an inverter circuit because the input voltage $V_{in}$ and the output voltage $V_{out}$ are opposite to each other.

When the input voltage $V_{in}$ is about 5V, a gate voltage $V_{gs}$ sensed by the first transistor Tr11 is about 0V, whereas a gate voltage $V_{gs}$ sensed by the second transistor Tr12 is about 5V. Thus, the second transistor Tr12 turns on and the output voltage $V_{out}$ is the ground voltage GND of about 0V. In this example, the circuit of FIG. 3 functions as an inverter circuit because the input voltage $V_{in}$ and the output voltage $V_{out}$ are opposite to each other.

In this example, the first transistor Tr11 turns on at a gate voltage $V_{gs}$ of about −5V, which shows a p-type transistor characteristic, whereas the second transistor Tr12 turns on at a gate voltage $V_{gs}$ of about 5V, which shows an n-type transistor characteristic. In this example, an inverter circuit may be realized using ambipolar transistors.

Figure 7:
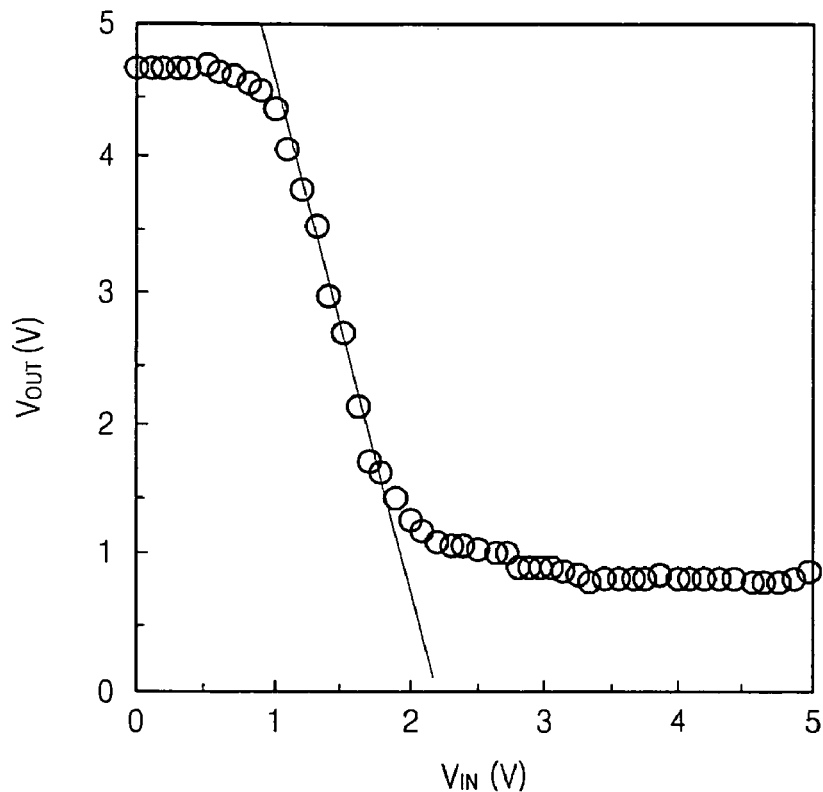
FIG. 7 is graph showing an inverter characteristic of carbon nanotube transistors when the power source voltage $V_{dd}$ is about 5V according to an example embodiment.

FIG. 7 is a graph showing an inverter characteristic of example embodiments of carbon nanotube transistors when the power source voltage $V_{dd}$ is about 5V.

The inverter circuit of the carbon nanotube transistors having ambipolar characteristics according to example embodiments is a relatively stable circuit because the carbon nanotube transistors having ambipolar characteristics are utilized without doping, and may be converted to a p-type or an n-type transistor according to the power source voltage $V_{dd}$.

Figure 8:
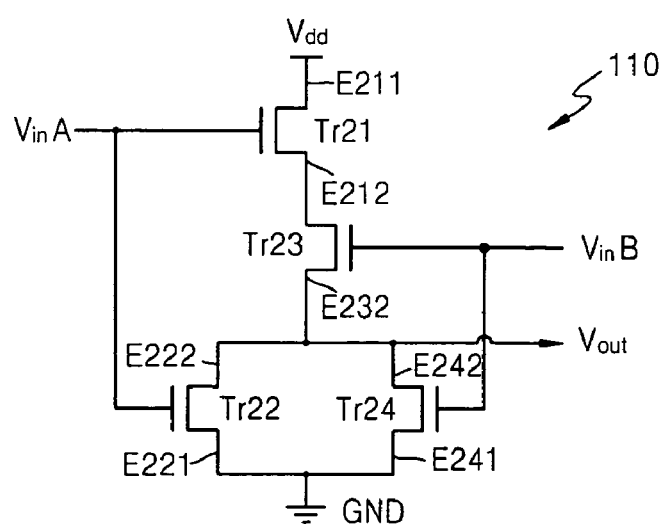
FIG. 8 is an example embodiment of a logic circuit including four carbon nanotube transistors having ambipolar characteristics.

FIG. 8 is an example embodiment of a logic circuit including four carbon nanotube transistors having ambipolar characteristics.

Referring to FIG. 8, a first input voltage $V_{in}A$ may be connected to a gate of a first transistor Tr21 and a gate of a second transistor Tr22. A second input voltage $V_{in}B$ may be connected to a gate of a third transistor Tr23 and a gate of a fourth transistor Tr24. A power source voltage $V_{dd}$ may be connected to a first electrode E211 of the first transistor Tr21. The first electrode of the third transistor Tr23 may be connected to a second electrode E212 of the first transistor Tr21 in series. The second transistor Tr22 and the fourth transistor Tr24 may be connected in parallel. First electrode E221 of the second transistor Tr22 and first electrode E241 of the fourth transistor Tr24 may be connected to a ground voltage GND. An output voltage $V_{out}$ may be output from a common node between the second electrode E222 of the second transistor Tr22, the second electrode E242 of the fourth transistor Tr24 and a second electrode E232 of the third transistor Tr23. Each of the first through fourth transistors Tr21 through Tr24 may be structured as the carbon nanotube transistor of FIG. 1, which has an ambipolar characteristic.

FIG. 9 is a truth table of an example embodiment of the logic circuit of FIG. 8 when the power source voltage $V_{dd}$ is about −5V. The first input voltage $V_{in}A$ and the second input voltage $V_{in}B$ may be about −5V or about 0V.

When the first input voltage $V_{in}A$ is about −5V, a gate voltage $V_{gs}$ sensed by the first transistor Tr21 is about 0V, whereas a gate voltage $V_{gs}$ sensed by the second transistor Tr22 is about −5V. Thus, the second transistor Tr22 turns on, acting as a p-type transistor, whereas the first transistor Tr21 turns off.

When the first input voltage $V_{in}A$ is about 0V, a gate voltage $V_{gs}$ sensed by the first transistor Tr21 is about 5V, whereas a gate voltage $V_{gs}$ sensed by the second transistor Tr22 is about 0V. Thus, the first transistor Tr21 turns on, acting as an n-type transistor, whereas the second transistor turns off.

When the second input voltage $V_{in}B$ is about −5V, a gate voltage $V_{gs}$ sensed by the third transistor Tr23 is about 0V, whereas a gate voltage $V_{gs}$ sensed by the fourth transistor Tr24 is about −5V. Thus, the fourth transistor Tr24 turns, acting as a p-type transistor, whereas the third transistor turns off.

When the second input voltage $V_{in}B$ is about 0V, a gate voltage $V_{gs}$ sensed by the third transistor Tr23 is about −5V, whereas a gate voltage $V_{gs}$ sensed by the fourth transistor Tr24 is about 0V. Thus, the third transistor Tr23 turns on acting as an n-type transistor, whereas the fourth transistor turns off.

Thus, as shown in FIG. 9, about −5V may serve as a low level signal and about 0V may serve as a high level signal. In this example, the logic circuit of FIG. 8 constitutes a NAND logic circuit. In this example, a NAND logic circuit may be realized using four carbon nanotube transistors having ambipolar characteristics.

FIG. 10 is another truth table of an example embodiment of the logic circuit of FIG. 8 when the power source voltage $V_{dd}$ is about 5V. The first input voltage $V_{in}A$ and the second input voltage $V_{in}B$ may be about 5V or about 0V.

When the first input voltage $V_{in}A$ is about 5V, a gate voltage $V_{gs}$ sensed by the first transistor Tr21 is about 0V, whereas a gate voltage $V_{gs}$ sensed by the second transistor Tr22 is about 5V. Thus, the second transistor Tr22 turns on acting as an n-type transistor, whereas the first transistor Tr21 turns off.

When the first input voltage $V_{in}A$ is about 0V, a gate voltage $V_{gs}$ sensed by the first transistor Tr21 is about −5V, whereas a gate voltage $V_{gs}$ sensed by the second transistor Tr22 is about 0V. Thus, the first transistor Tr21 turns on acting as a p-type transistor, whereas the second transistor Tr22 turns off.

When the second input voltage $V_{in}B$ is about 5V, a gate voltage $V_{gs}$ sensed by the third transistor Tr23 is about 0V, whereas a gate voltage $V_{gs}$ sensed by the fourth transistor Tr24 is about 5V. Thus, the fourth transistor Tr24 turns on acting as an n-type transistor, whereas the third transistor Tr23 turns off.

When the second input voltage $V_{in}B$ is about 0V, a gate voltage $V_{gs}$ sensed by the third transistor Tr23 is about −5V, whereas a gate voltage $V_{gs}$ sensed by the fourth transistor Tr24 is about 0V. Thus, in this example, the third transistor Tr23 turns on acting as a p-type transistor, whereas the fourth transistor Tr24 turns off.

Thus, as shown in FIG. 10, about 0V may serve a low level signal and about 5V may serve as a high level signal. In this example, the logic circuit of FIG. 8 functions as a NOR logic circuit. In this example, a NOR logic circuit may be realized using four carbon nanotube transistors having ambipolar characteristics.

Also, the example embodiment of the logic circuit of FIG. 8 may be converted or configured as a NOR logic circuit and a NAND logic circuit according to the power source voltage $V_{dd}$.

Figures 11, 12:
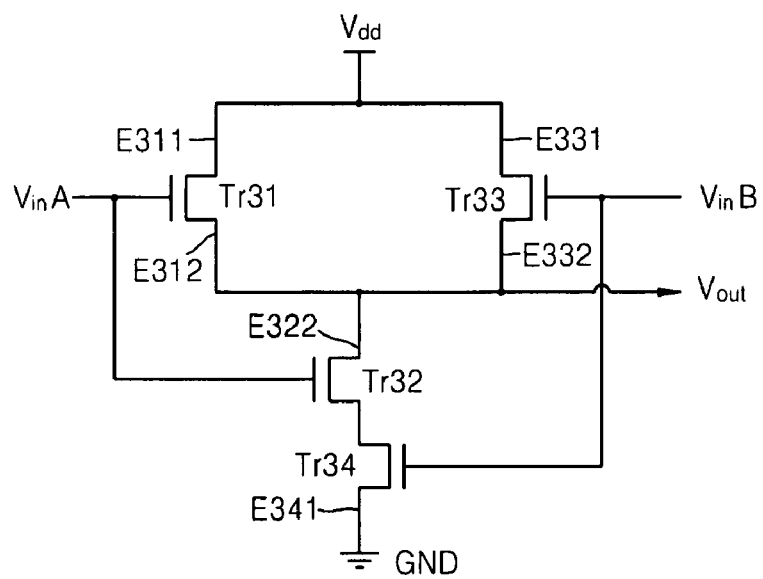
FIG. 11 is an example embodiment of a logic circuit having four carbon nanotube transistors having ambipolar characteristics.
FIG. 12 is a truth table of an example embodiment of the logic circuit of FIG. 11 when a power source voltage $V_{dd}$ is about −5V.

FIG. 11 is another example embodiment of a logic circuit including four carbon nanotube transistors having ambipolar characteristics.

Referring to FIG. 11, a first input voltage $V_{in}A$ may be connected to gates of a first transistor Tr31 and a second transistor Tr32. A second input voltage $V_{in}B$ may be connected to gates of a third transistor Tr33 and a fourth transistor Tr34. The first transistor Tr31 and the third transistor Tr33 may be connected in parallel, and a power source voltage $V_{dd}$ may be connected to a first electrode E311 of the first transistor Tr31 and a first electrode E331 of the third transistor Tr33. The second transistor Tr32 and the fourth transistor Tr34 may be connected in series, and a ground voltage GND may be connected to a first electrode E341 of the fourth transistor Tr34. An output voltage $V_{out}$ may be output from a common node between second electrode E312 of the first transistor Tr31 and the second electrode E332 of the third transistor Tr33 and a second electrode E322 of the second transistor Tr32. Each of the first through fourth transistors Tr31 through Tr34 may be structured as the carbon nanotube transistors of FIG. 1, which has an ambipolar characteristic.

FIG. 12 is a truth table of an example embodiment of a logic circuit of FIG. 11 when a power source voltage $V_{dd}$ is about −5V. The first input voltage $V_{in}A$ and the second input voltage $V_{in}B$ may be about −5V or about 0V.

When the first input voltage $V_{in}A$ is about −5V, a gate voltage $V_{gs}$ sensed by the first transistor Tr31 is about 0V, whereas a gate voltage $V_{gs}$ sensed by the second transistor Tr32 is about −5V. Thus, the second transistor Tr32 turns on acting as a p-type transistor, whereas the first transistor Tr31 turns off.

When the first input voltage $V_{in}A$ is about 0V, a gate voltage $V_{gs}$ sensed by the first transistor Tr31 is about 5V, whereas a gate voltage $V_{gs}$ sensed by the second transistor Tr32 is about 0V. Thus, the first transistor Tr31 turns on acting as an n-type transistor, whereas the second transistor Tr32 turns off.

When the second input voltage $V_{in}B$ is about −5V, a gate voltage $V_{gs}$ sensed by the third transistor Tr33 is about 0V, whereas a gate voltage $V_{gs}$ sensed by the fourth transistor Tr34 is about −5V. Thus, the fourth transistor Tr34 turns on acting as a p-type transistor, whereas the third transistor Tr33 turns off.

When the second input voltage $V_{in}B$ is about 0V, a gate voltage $V_{gs}$ sensed by the third transistor Tr33 is about −5V, whereas a gate voltage $V_{gs}$ sensed by the fourth transistor Tr34 is about 0V. Thus, the third transistor Tr33 turns on acting as an n-type transistor, whereas the fourth transistor Tr34 turns off.

Thus, as shown in FIG. 12, about −5V may be a low level signal and about 0V may be a high level signal. Accordingly, the example embodiment of the logic circuit of FIG. 11 functions as a NOR logic circuit. In this example, a NOR logic circuit may be realized using four carbon nanotube transistors having ambipolar characteristics.

FIG. 13 is another truth table of an example embodiment of the logic circuit of FIG. 11 when a power source voltage $V_{dd}$ is about 5V. The first input voltage $V_{in}A$ and the second input voltage $V_{in}B$ may be about 5V or about 0V.

When the first input voltage $V_{in}A$ is about 5V, a gate voltage $V_{gs}$ sensed by the first transistor Tr31 is about 0V, whereas a gate voltage $V_{gs}$ sensed by the second transistor Tr32 is about 5V. Thus, the second transistor Tr32 turns on acting as an n-type transistor, whereas the first transistor Tr31 turns off.

When the first input voltage $V_{in}A$ is about 0V, a gate voltage $V_{gs}$ sensed by the first transistor Tr31 is about −5V, whereas a gate voltage $V_{gs}$ sensed by the second transistor Tr32 is about 0V. Thus, the first transistor Tr31 turns on acting as a p-type transistor, whereas the second transistor Tr32 turns off.

When the second input voltage $V_{in}B$ is about 5V, a gate voltage $V_{gs}$ sensed by the third transistor Tr33 is about 0V, whereas a gate voltage $V_{gs}$ sensed by the fourth transistor Tr34 is about 5V. Thus, the fourth transistor Tr34 turns on acting as an n-type transistor, whereas the third transistor Tr33 turns off.

When the second input voltage $V_{in}B$ is about 0V, a gate voltage $V_{gs}$ sensed by the third transistor Tr33 is about −5V, whereas a gate voltage $V_{gs}$ sensed by the fourth transistor Tr34 is about 0V. Thus, the third transistor Tr33 turns on acting as a p-type transistor, whereas the fourth transistor Tr34 turns off.

Thus, as shown in FIG. 13, about 0V may serve as a low level signal and about 5V may serve as a high level signal, and the logic circuit of FIG. 11 may function as a NAND logic circuit. In this example, NAND logic circuit may be realized using four carbon nanotube transistors having ambipolar characteristics.

Logic circuits including carbon nanotube transistors having ambipolar characteristics according to example embodiments may be configured using the ambipolar characteristics of the carbon nanotube transistors, without the need of a complicated doping process on the carbon nanotubes to a p-type or an n-type. Changing the polarity of the power source voltage $V_{dd}$ may readily change the characteristics of the carbon nanotube transistors to an n-type or p-type, and thus, a CMOS type logic circuit may be more readily formed. A NOR logic circuit may be converted to a NAND logic circuit and vice versa more readily by changing the polarity of the power source voltage $V_{dd}$.

While the present invention has been particularly shown and described with reference to example embodiments thereof, it will be understood by one of ordinary skill in the art that various changes in form and details may be made therein without departing from the spirit and scope of the present invention as defined by the following claims.

What is claimed is:

1. A convertible logic circuit, comprising:
   a plurality of carbon nanotube transistors having an ambipolar characteristic, each of the plurality of carbon nanotube transistors being configurable as a p-type or an n-type transistor according to a voltage level of a power source voltage,
   wherein the convertible logic circuit is configured to function differently based on the voltage level of the power source voltage, and
   the convertible logic circuit is configured to receive the power source voltage at one of a source electrode and a drain electrode of at least one of the plurality of carbon nanotube transistors.

2. The convertible logic circuit of claim 1, wherein each of the plurality of carbon nanotube transistors includes,
   the source electrode,
   the drain electrode,
   a channel arranged between the source electrode and the drain electrode, the channel being formed of a carbon nanotube,
   a gate insulating layer formed on the carbon nanotube, and
   a gate electrode formed on the gate insulating layer.

3. The convertible logic circuit of claim 2, wherein the channel is formed of a network of carbon nanotubes.

4. The convertible logic circuit of claim 1, wherein the plurality of carbon nanotube transistors include,
   a first transistor and a second transistor connected in series,
      a gate of the first transistor and a gate of the second transistor being connected to an input voltage, and wherein
      the power source voltage is connected to a first electrode of the first transistor,
      a ground voltage is connected to a second electrode of the second transistor, and
      an output voltage is output from a common node between the first transistor and the second transistor.

5. The convertible logic circuit of claim 4, wherein if the power source voltage is a negative voltage, the first transistor acts as an n-type transistor and the second transistor acts as a p-type transistor.

6. The convertible logic circuit of claim 4, wherein if the power source voltage is a positive voltage, the first transistor acts as a p-type transistor and the second transistor acts as an n-type transistor.

7. The convertible logic circuit of claim 1, wherein the logic circuit acts as a first logic circuit or a second logic circuit according to the power source voltage, the first and second logic circuits being different.

8. The convertible logic circuit of claim 1, wherein each of the plurality of carbon nanotube transistors is independently configurable as one of an n-type or a p-type transistor based on the input voltage.

9. The convertible logic circuit of claim 8, wherein the logic circuit is configurable as an inverter circuit according to a configuration of the carbon nanotube transistors as n-type or p-type transistors.

10. A convertible logic circuit, comprising:
    a plurality of carbon nanotube transistors having an ambipolar characteristic, each of the plurality of carbon nanotube transistors being configurable as a p-type or an n-type transistor according to a voltage level of a power source voltage,
    wherein the convertible logic circuit is configured to function differently based on the voltage level of the power source voltage,
    the logic circuit acts as a first logic circuit or a second logic circuit according to the power source voltage, the first and second logic circuits being different,
    and the first logic circuit is a NOR logic circuit and the second logic circuit is a NAND logic circuit.

11. The convertible logic circuit of claim 10, wherein the plurality of carbon nanotube transistors include,
    a first transistor and a second transistor, the first and second transistors having gates configured to receive a first input signal, and
    a third transistor and a fourth transistor, the third and fourth transistors having gates configured to receive a second input signal, the first transistor and the third transistor being connected in series, and the second transistor and the fourth transistor being connected in parallel, wherein
    the power source voltage is connected to a first electrode of the first transistor,
    a ground voltage is connected to first electrodes of the second transistor and the fourth transistor, and an output voltage is output from a common node between a second electrode of the second transistor, a second electrode of the fourth transistor and a second electrode of the third transistor.

12. The convertible logic circuit of claim 11, wherein if the power source voltage is a negative voltage, the first transistor and the third transistor act as n-type transistors, the second transistor and the fourth transistor act as p-type transistors, and the logic circuit is a NAND logic circuit.

13. The convertible logic circuit of claim 11, wherein if the power source voltage is a positive voltage, the first transistor and the third transistor act as p-type transistors, the second transistor and the fourth transistor act as n-type transistors, and the logic circuit is a NOR logic circuit.

14. The convertible logic circuit of claim 10, wherein the plurality of carbon nanotube transistors include,
    a first transistor and a second transistor, the first and second transistors having gates configured to receive a first input signal, and
    a third transistor and a fourth transistor, the third and fourth transistors having gates configured to receive a second input signal, the first transistor and the third transistor being connected in parallel and the second transistor and the fourth transistor being connected in series, wherein
        a first electrode of the fourth transistor is connected to a ground voltage,
        a first electrode of the first transistor and a first electrode of the third transistor are connected to the power source voltage, and
        an output voltage is output from a common node between a second electrode of the first transistor, a second electrode of the third transistor and a second electrode of the second transistor.

15. The convertible logic circuit of claim 14, wherein if the power source voltage is a first negative voltage, the first transistor and the third transistor act as n-type transistors, the second transistor and the fourth transistor act as p-type transistors, and the logic circuit is a NOR logic circuit.

16. The convertible logic circuit of claim 14, wherein if the power source voltage is a first positive voltage, the first transistor and the third transistor act as p-type transistors, the second transistor and the fourth transistor act as n-type transistors, and the logic circuit is a NAND logic circuit.

17. The convertible logic circuit of claim 10, wherein at least one of the plurality of carbon nanotube transistors includes,
    a source electrode,
    a drain electrode,
    a channel arranged between the source electrode and the drain electrode, the channel being a network of carbon nanotubes,
    a gate insulating layer formed on the network of carbon nanotubes, and
    a gate electrode on the gate insulating layer.

18. A convertible logic circuit, comprising;
    a plurality of carbon nanotube transistors having an ambipolar characteristic, each of the plurality of carbon nanotube transistors being configurable as a p-type or an n-type transistor according to a voltage level of a power source voltage,
    wherein the convertible logic circuit is configured to function differently based on the voltage level of the power source voltage,
    each of the plurality of carbon nanotube transistors is independently configurable as one of an n-type or a p-type transistor based on an input voltage, and
    the logic circuit is configurable as one of a NAND or a NOR logic circuit according to a configuration of the carbon nanotube transistors as n-type or p-type transistors.

19. The convertible logic circuit of claim 18, wherein at least one of the plurality of carbon nanotube transistors includes,
    a source electrode,
    a drain electrode,
    a channel arranged between the source electrode and the drain electrode, the channel being a network of carbon nanotubes,
    a gate insulating layer formed on network of carbon nanotubes, and a gate electrode formed on the gate insulating layer.

* * * * *